United States Patent
Anjyou et al.

(10) Patent No.: US 9,609,249 B2
(45) Date of Patent: Mar. 28, 2017

(54) SOLID-STATE IMAGING DEVICE, IMAGING APPARATUS, AND ELECTRONIC APPARATUS WITH NEGATIVE FEEDBACK CIRCUIT

(71) Applicant: Sony Corporation, Tokyo (JP)

(72) Inventors: Kenichirou Anjyou, Kagoshima (JP); Jyunichirou Kusuda, Kagoshima (JP)

(73) Assignee: Sony Corporation, Tokyo (JP)

( * ) Notice: Subject to any disclaimer, the term of this patent is extended or adjusted under 35 U.S.C. 154(b) by 176 days.

(21) Appl. No.: 14/561,036

(22) Filed: Dec. 4, 2014

(65) Prior Publication Data
US 2015/0163438 A1 Jun. 11, 2015

(30) Foreign Application Priority Data
Dec. 11, 2013 (JP) .................................. 2013-255922

(51) Int. Cl.
H04N 5/374 (2011.01)
H04N 5/378 (2011.01)
H03F 1/34 (2006.01)

(52) U.S. Cl.
CPC .......... *H04N 5/3742* (2013.01); *H03F 1/342* (2013.01); *H04N 5/378* (2013.01); *H03F 2200/453* (2013.01)

(58) Field of Classification Search
CPC .... H04N 5/3745; H04N 5/3742; H04N 5/378; H04N 5/37457; H03F 1/342; H03F 1/34; H03F 2200/453

(Continued)

(56) References Cited

U.S. PATENT DOCUMENTS 4,656,503 A * 4/1987 Hynecek ........... H01L 27/14868
257/225
6,130,423 A * 10/2000 Brehmer .............. H04N 3/1512
250/208.1

(Continued)

FOREIGN PATENT DOCUMENTS

JP 2004-023135 A 1/2004

OTHER PUBLICATIONS

Yonemoto et al., "A CMOS Image Sensor with a Simple FPN-Reduction Technology and a Hole Accumulated Diode", vol. 55, No. 2, The Institute of Image Information and Television Engineers, 2001, 5 pages.

*Primary Examiner* — Que T Le
*Assistant Examiner* — Jennifer Bennett
(74) *Attorney, Agent, or Firm* — Sheridan Ross P.C.

(57) ABSTRACT

A solid-state imaging device includes a photodiode that generates a signal charge by photoelectric conversion according to received light, a floating diffusion that accumulates the signal charge generated by the photodiode, an amplification transistor that amplifies and outputs a power source voltage according to the signal charge accumulated in the floating diffusion, a dummy transistor having the same characteristics as the amplification transistor, and a negative feedback circuit that applies a negative feedback to the dummy transistor such that respective source currents of the amplification transistor and the dummy transistor are equal to each other. The respective source currents of the amplification transistor and the dummy transistor are controlled so as to coincide with each other by the negative feedback circuit.

9 Claims, 9 Drawing Sheets

(58) Field of Classification Search
USPC ...... 250/208.1, 214 A, 214 R; 348/294, 300, 348/301, 302, 308; 257/257, 258, 290, 257/291, 292
See application file for complete search history.

(56) References Cited

U.S. PATENT DOCUMENTS

| | | | | |
|---|---|---|---|---|
| 6,952,004 | B2* | 10/2005 | Henderson | H04N 5/3745 250/208.1 |
| 7,265,329 | B2* | 9/2007 | Henderson | H03M 1/1023 250/208.1 |
| 2004/0251977 | A1* | 12/2004 | Bellaouar | H03B 5/04 331/117 R |

* cited by examiner

SOLID-STATE IMAGING DEVICE, IMAGING APPARATUS, AND ELECTRONIC APPARATUS WITH NEGATIVE FEEDBACK CIRCUIT

CROSS REFERENCE TO RELATED APPLICATIONS

This application claims the benefit of Japanese Priority Patent Application JP 2013-255922 filed Dec. 11, 2013, the entire contents of which are incorporated herein by reference.

BACKGROUND

The present disclosure relates to a solid-state imaging device, an imaging apparatus, and an electronic apparatus, and particularly, to a solid-state imaging device, an imaging apparatus, and an electronic apparatus, capable of allowing an influence by nonlinearity latent in output of an amplification transistor output by a current transmission system to be improved with a simpler circuit structure in output of pixel signals from a floating diffusion.

In a column system adopted as a typical CMOS (Complementary Metal-Oxide Semiconductor) image sensor, light incident on each unit pixel is output from a signal line as a pixel signal per pixel in such a manner that the light is photoelectrically converted by a photodiode to generate a signal charge, the signal charge is transferred to a floating diffusion by a transfer transistor, and a potential variation of the floating diffusion is converted into a signal voltage and simultaneously amplified by an amplification transistor.

Here, the floating diffusion is connected to a gate of the amplification transistor. A source of the amplification transistor is connected to a load transistor (current source) and a drain of the amplification transistor is connected to a power source.

In this case, the amplification transistor and the load transistor constitute a source follower circuit. That is, a voltage variation in the gate of the amplification transistor is drawn to the source of the amplification transistor as a voltage amplitude at about one times, and a voltage signal is output to a next stage as a pixel signal.

This is generally referred to as a voltage transmission system. In the voltage transmission system, it is necessary to increase mutual conductance of the amplification transistor in order to realize high bandwidth, but the mutual conductance may not be freely adjusted since a ratio (W/L) of a channel width W to a channel length L in the amplification transistor is determined from conversion efficiency at the floating diffusion.

In addition, when only a source current of the amplification transistor is increased, a gate-source voltage of the amplification transistor becomes larger and a voltage drop also becomes larger. For this reason, a subsequent DC (Direct Current) circuit design (direct current circuit design) is difficult considering an output dynamic range.

That is, since the source current of the amplification transistor may not be excessively increased, it is difficult to realize high bandwidth.

As countermeasures, a current transmission system is proposed in which a voltage is fixed as in a diode or the like so that a current is drawn, without current source connection of a source of an amplification transistor.

Since this circuit may simply increase the current by adjusting a channel width W of the diode, high bandwidth is easily realized. In addition, since a voltage variation is very small relative to an input dynamic range, a subsequent DC circuit design is also easily performed (see ITE Technical Report Vol. 24, No. 27, PP. 1-4, March, 2000).

The drawn current is converted into a voltage signal by an IV amplification conversion circuit (current-voltage amplification conversion circuit) and is used. This is the current transmission system.

However, the source current of the amplification transistor has nonlinear characteristics with respect to a voltage variation of a floating diffusion.

In this case, gain deterioration occurs when output impedance of the IV amplification conversion circuit is not lowered. Accordingly, an impedance conversion circuit is necessary as a countermeasure (see Japanese Unexamined Patent Application Publication No. 2004-023135).

SUMMARY

However, when the current transmission system is used, the impedance conversion circuit is necessary as described above. Thus, the circuit scale is enlarged and complicated.

In addition, although the impedance conversion circuit is provided with a current mirror circuit, an output offset voltage of the IV amplification conversion circuit occurs when the current is deviated by the current mirror circuit. Therefore, an offset cancel circuit is also actually necessary as a countermeasure and thus the circuit scale is further enlarged.

Furthermore, the offset cancel circuit may not be operated in real time, and the offset voltage of the IV amplification conversion circuit necessarily has to be monitored. Accordingly, it is also necessary to provide an offset cancel time for specifying a correction amount of the offset voltage.

In addition, since shot noise is applied to input of the IV amplification conversion circuit by the impedance conversion circuit, it is easily influenced by the noise.

Furthermore, since the ratio (W/L) of the channel width W to the channel length L in the amplification transistor is very small in order to increase conversion efficiency at the floating diffusion, an influence of variation of a threshold voltage Vth of the amplification transistor is also increased.

That is, when the threshold voltage Vth of the amplification transistor is varied, an output current is similarly varied by the influence. For this reason, the current is applied, as it is, to the IV amplification conversion circuit, the variation appears, as it is, at an output voltage.

Accordingly, in the current transmission system, it is difficult to combine improvements of high bandwidth and nonlinearity in a balanced manner.

It is desirable to output pixel signals by suppressing an influence by nonlinearity and a variation of an output voltage in a balanced manner while high bandwidth is realized, by means of application of a current transmission system.

A solid-state imaging device according to an embodiment of the present disclosure includes a photodiode that generates a signal charge by photoelectric conversion according to received light, a floating diffusion that accumulates the signal charge generated by the photodiode, an amplification transistor that amplifies and outputs a power source voltage according to the signal charge accumulated in the floating diffusion, a dummy transistor having the same characteristics as the amplification transistor, and a negative feedback circuit that applies a negative feedback to the dummy transistor such that respective source currents of the amplification transistor and the dummy transistor are equal to each other, wherein the respective source currents of the amplification transistor and the dummy transistor are controlled so as to coincide with each other by the negative feedback circuit.

The negative feedback circuit may convert the source current of the amplification transistor into a gate voltage and output a gate voltage of the dummy transistor as a pixel signal while the negative feedback is applied by outputting the gate voltage of the dummy transistor.

The negative feedback circuit may include two current source circuits configured to be current sources of the respective source currents of the amplification transistor and the dummy transistor, and an operational amplifier that applies the negative feedback by outputting the gate voltage of the dummy transistor such that currents of the two current source circuits coincide with each other.

The two current source circuits may be configured by respective diode-connected transistors and each be configured such that sources of the amplification transistor and the dummy transistor are connected to respective gate and drain, and the operational amplifier may apply the negative feedback by outputting the gate voltage of the dummy transistor such that respective gate-source voltages of the diode-connected transistors configuring the two current source circuits coincide with each other.

The two current source circuits may be configured by respective resistances connected in series to sources of the amplification transistor and the dummy transistor, and the operational amplifier may apply the negative feedback by outputting the gate voltage of the dummy transistor such that both end voltages of the respective resistances connected in series coincide with each other.

The current source circuit may be configured by an inversion input terminal of an operational amplifier in which a power source is connected to a non-inversion input terminal, and the operational amplifier may be configured such that a negative feedback is applied by outputting a gate voltage of the dummy transistor such that gate-source voltages of the dummy transistor and the amplification transistor coincide with each other when a source of the amplification transistor is connected in series to a gate and a drain of the dummy transistor that is diode-connected and the gate and drain of the dummy transistor and the source of the amplification transistor are connected to an inversion input terminal of the operational amplifier, and thus the output voltage is output as a pixel signal.

The negative feedback circuit may include a first current source circuit that generates a current coinciding with the source current of the amplification transistor, a second current source circuit that generates a current coinciding with the source current of the dummy transistor, and a negative feedback transistor in which a differential current of both of the first and second current source circuits is input to a gate and a source thereof is connected to the gate of the dummy transistor, and a negative feedback may be applied by the differential current.

An imaging apparatus according to another embodiment of the present disclosure includes a photodiode that generates a signal charge by photoelectric conversion according to received light, a floating diffusion that accumulates the signal charge generated by the photodiode, an amplification transistor that amplifies and outputs a power source voltage according to the signal charge accumulated in the floating diffusion, a dummy transistor having the same characteristics as the amplification transistor, and a negative feedback circuit that applies a negative feedback to the dummy transistor such that respective source currents of the amplification transistor and the dummy transistor are equal to each other, wherein the respective source currents of the amplification transistor and the dummy transistor are controlled so as to coincide with each other by the negative feedback circuit.

An electronic apparatus according to still another embodiment of the present disclosure includes a photodiode that generates a signal charge by photoelectric conversion according to received light, a floating diffusion that accumulates the signal charge generated by the photodiode, an amplification transistor that amplifies and outputs a power source voltage according to the signal charge accumulated in the floating diffusion, a dummy transistor having the same characteristics as the amplification transistor, and a negative feedback circuit that applies a negative feedback to the dummy transistor such that respective source currents of the amplification transistor and the dummy transistor are equal to each other, wherein the respective source currents of the amplification transistor and the dummy transistor are controlled so as to coincide with each other by the negative feedback circuit.

According to the embodiments of the present disclosure, a signal charge is generated by photoelectric conversion by means of a photodiode according to received light, the signal charge generated by the photodiode is accumulated by a floating diffusion, a power source voltage is amplified and output by means of an amplification transistor according to the signal charge accumulated in the floating diffusion, a dummy transistor having the same characteristics as the amplification transistor is provided, a negative feedback is applied to the dummy transistor by a negative feedback circuit such that respective source currents of the amplification transistor and the dummy transistor are equal to each other, and the respective source currents of the amplification transistor and the dummy transistor are controlled so as to coincide with each other by the negative feedback circuit.

According to the embodiments of the present disclosure, it may be possible to output voltage signals as pixel signals by suppressing an influence by nonlinearity and a variation of an output voltage while high bandwidth is realized, by means of application of a current transmission system.

DETAILED DESCRIPTION OF EMBODIMENTS

Embodiments of the present disclosure (hereinafter, referred to as "embodiments") will be described below. The description will be given in the order indicated below.

1. A first embodiment (an example of using a transistor and an operational amplifier in a negative feedback circuit)
2. A second embodiment (an example of using a resistance and an operational amplifier in a negative feedback circuit)
3. A third embodiment (an example of using a power source and an operational amplifier in a negative feedback circuit)
4. A fourth embodiment (an example of not using an operational amplifier in a negative feedback circuit)

1. First Embodiment

Configuration Example of Typical CCD Image Sensor

In the description of the present disclosure, a configuration example of a typical image sensor will be first described with reference to FIG. 1.

Figure 1:
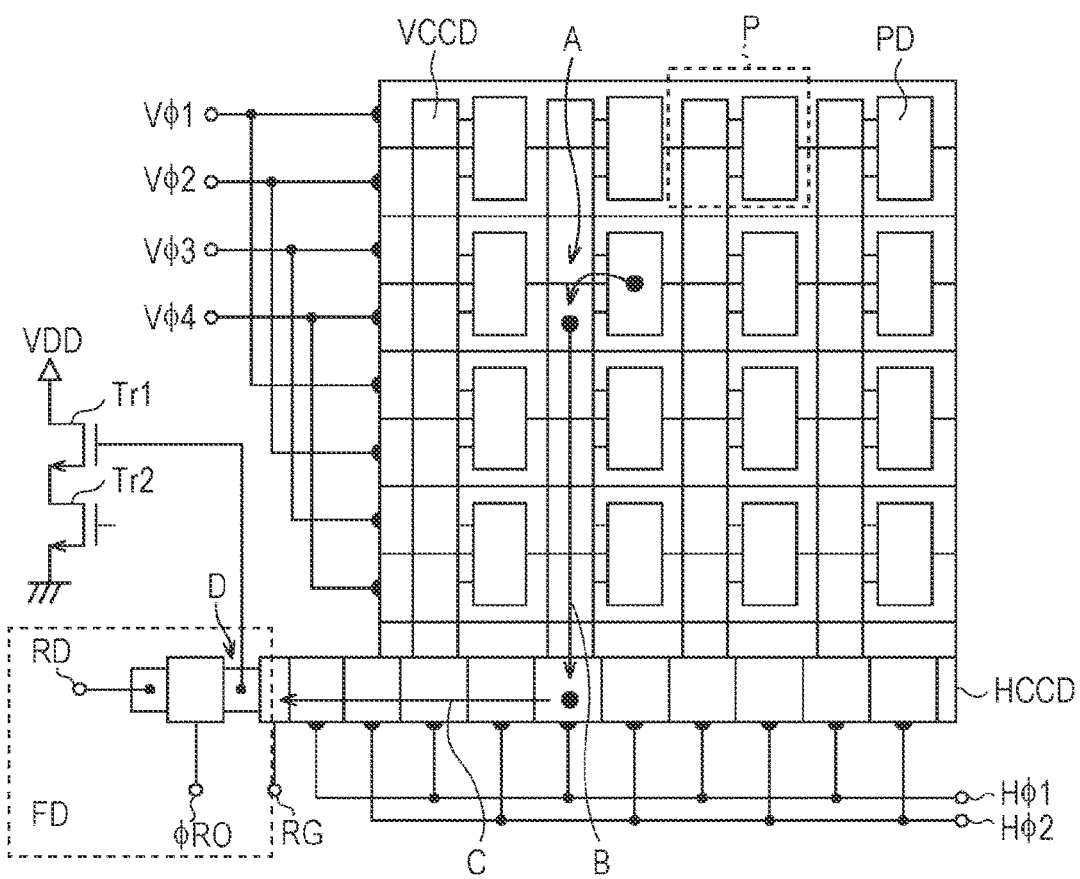
FIG. 1 is a diagram for explaining a configuration example of a typical CCD image sensor.

As shown in FIG. 1, pixels P are arranged in a two-dimensional matrix form in a typical CCD image sensor and the respective pixels are provided with photodiodes PD which photoelectrically convert incident light to generate signal charges. Vertical transfer resistors VCCD are arranged between respective lines of the pixels P in a horizontal direction thereof. When the signal charges are read from the photodiodes PD and transferred in a direction of an arrow A, the vertical transfer resistors VCCD transfer the read signal charges to a horizontal transfer resistor HCCD at a lower portion in the drawing in a vertical direction in a direction of an arrow B, according to vertical control signals $V\phi 1$ to $V\phi 4$.

The horizontal transfer resistor HCCD transfers the signal charges to a floating diffusion FD in a horizontal direction as indicated by an arrow C, based on horizontal transfer signals $H\phi 1$ and $H\phi 2$. Voltages according to the signal charges detected from a signal detection section D in the floating diffusion FD are amplified as pixel signals in an amplification transistor Tr1 to be output when a row selection transistor Tr2 is turned on.

That is, a potential variation of the floating diffusion FD is converted into a signal voltage by an MOS (Metal Oxide Semiconductor) transistor Tr1 and is amplified, so as to be output as a pixel signal.

In this way, the signal charges, which are photoelectrically converted and generated by the photodiodes PD in the respective pixels P of imaging regions arranged in the two-dimensional form, are transferred to the floating diffusion FD. However, a transfer rate in frame transfer has a limit by factors such as a large number of pixels and thus this limit interrupts an aim of high bandwidth. That is, it is difficult to realize the high bandwidth above a certain level in a frame transfer system.

Configuration Example of Typical CMOS Image Sensor

Next, a configuration example of a typical CMOS (Complementary Metal Oxide Semiconductor) image sensor will be described with reference to FIG. 2.

With the above-mentioned CCD image sensor, a CMOS image sensor mainly adopts a column system.

Figure 2:
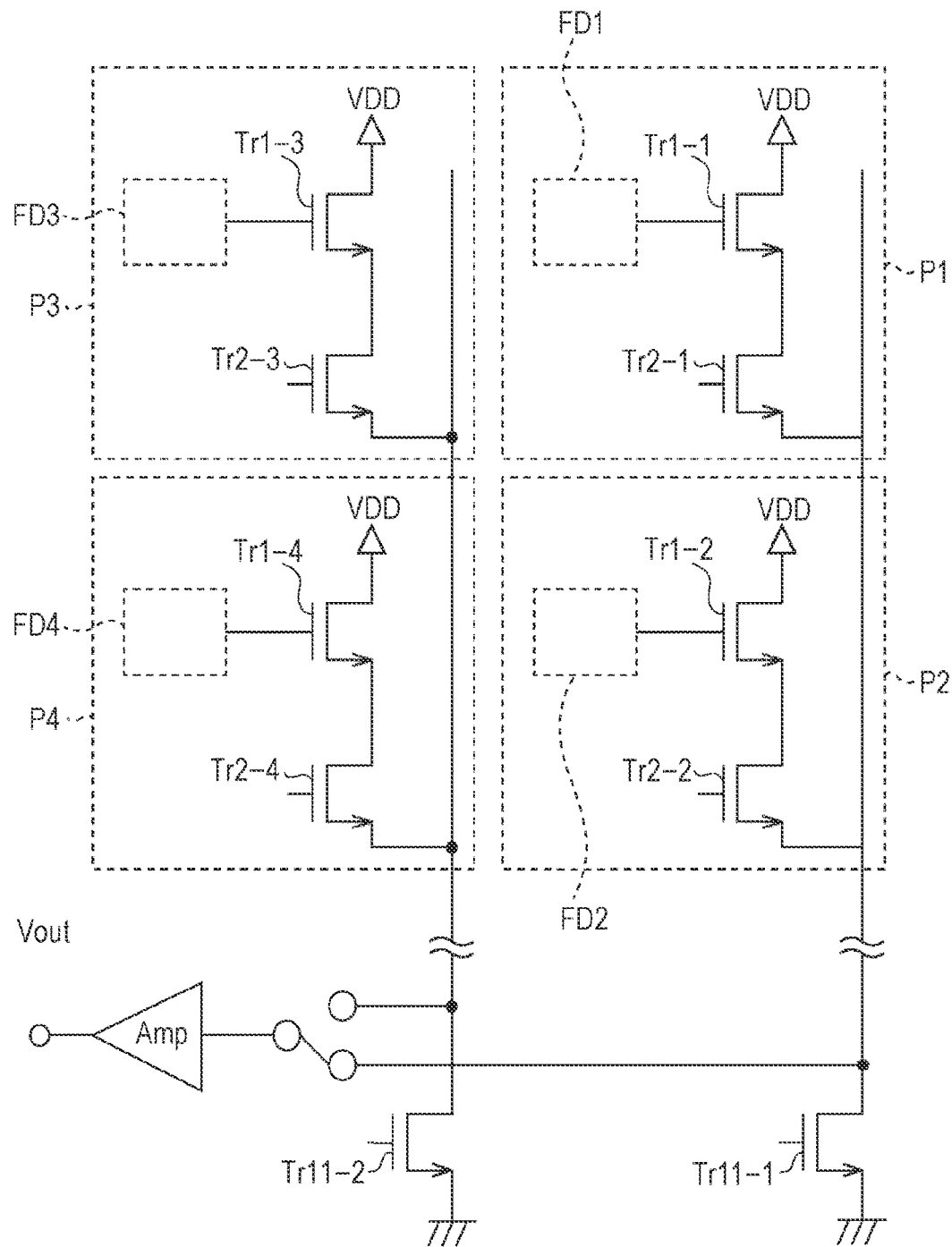
FIG. 2 is a diagram for explaining a configuration example of a typical CMOS image sensor.

That is, as shown in FIG. 2, respective unit pixels P1 to P4 arranged in a two-dimensional form are provided with floating diffusions FD1 to FD4, amplification transistors Tr1-1 to Tr1-4 for converting signal charges into voltage signals, and row selection transistors Tr2-1 to Tr2-4, respectively, in the typical CMOS image sensor. In addition, four pixels P1 to P4 are indicated in FIG. 2, but four or more pixels are actually arranged.

Light incident on the respective unit pixels is photoelectrically converted so as to generate signal charges by photodiodes (not shown), the signal charges are transferred to the floating diffusions FD1 to FD4 by transfer transistors (not shown), and potential variations of the floating diffusions FD1 to FD4 are converted into signal voltages and simultaneously amplified by the amplification transistors Tr1-1 to Tr1-4. Consequently, the light is output from signal lines as pixel signals per pixel.

Since frame transfer is not used in this column system, the signal transfer does not cause rate-limiting of high bandwidth. However, in a place at which voltage and current amplitudes from each pixel are bundled into one, influences by parasitic capacitances of the selection transistors Tr11-1, Tr11-2 . . . of all pixels, parasitic capacitances of wiring, and parasitic resistances are exhibited. That is, a parasitic CR filter is configured in an invisible form by various parasitic capacitances and parasitic resistances, thereby interrupting the high bandwidth.

As a countermeasure, AD (Analogue/Digital) conversion processing per column is performed in a parallel manner in the typical CMOS image sensor, such that the influence by the parasitic CR filter is prevented.

Voltage Transmission System and Current Transmission System

Next, a voltage transmission system and a current transmission system which are an output system when a signal charge from each pixel is output as a pixel signal will be described with reference to FIG. 3.

Figure 3:
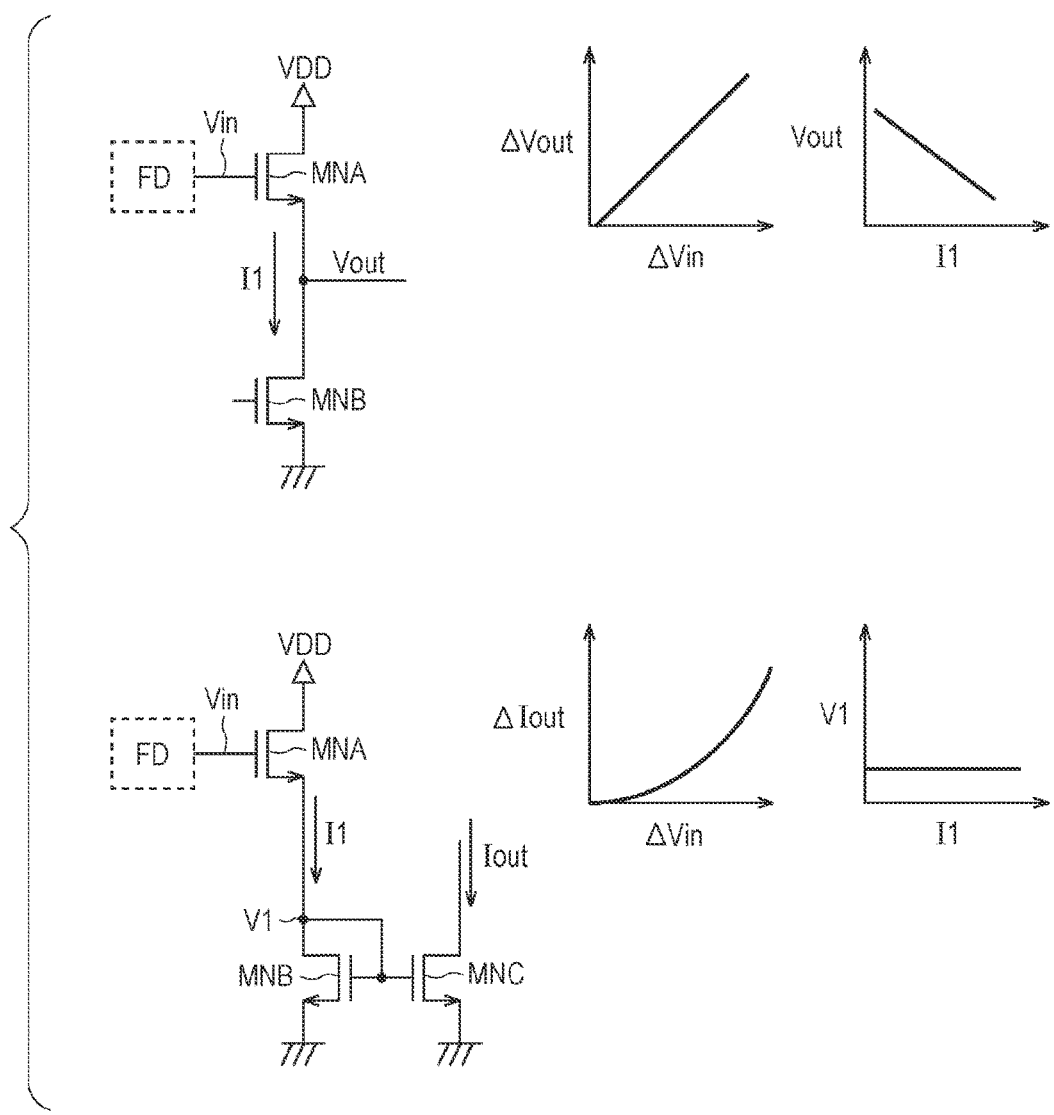
FIG. 3 is a diagram for explaining a voltage transmission system and a current transmission system.

As shown in a left upper portion of FIG. 3, a voltage signal from each pixel is output using a source follower circuit in the voltage transmission system.

That is, a signal charge from each pixel is accumulated in a floating diffusion FD. The floating diffusion FD is connected to a gate of an amplification transistor MNA. A source of the amplification transistor MNA is connected to a load transistor (current source) MNB and a drain thereof is connected to a power source VDD.

In this case, the amplification transistor MNA and the load transistor (current source) MNB constitute the source follower circuit. That is, as shown in a central upper portion of FIG. 3, a voltage variation (deltaVin) ("deltaVin" being a symbol in the drawings) in the gate of the amplification transistor MNA is drawn to the source of the amplification transistor MNA as a voltage amplitude (deltaVout) at about one times, and is output to a next stage as a voltage signal.

Here, it is necessary to increase mutual conductance gm $(=\sqrt{2Id\beta}$ (Id being a drain-source current, and $\beta$ being a coefficient)) of the amplification transistor MNA in order to realize high bandwidth, but the mutual conductance gm may not be freely adjusted since a ratio (W/L) between a channel width W and a channel length L in the amplification transistor MNA, which is a parameter represented by rate-limiting of the mutual conductance gm, is determined from conversion efficiency at the floating diffusion FD.

In addition, as shown in a right upper portion of FIG. 3, when only a source current I1 of the amplification transistor MNA is increased, an output voltage Vout is decreased since a gate-source voltage Vgs of the amplification transistor MNA becomes larger and a voltage drop also becomes larger. For this reason, difficulty of a subsequent direct current circuit design is increased, considering an output dynamic range. That is, since the source current I1 of the amplification transistor MNA may also not be excessively increased, it is difficult to realize high bandwidth.

Meanwhile, the current transmission system is a system proposed as the above-mentioned countermeasure. That is, as shown in a left lower portion of FIG. 3, the current transmission system is a system of drawing a pixel signal as a current by connecting a diode or the like to a circuit to which a voltage is fixed, without current source connection of the source of the amplification transistor MNA.

Since this circuit may simply increase a current by adjusting the channel width W of the diode, high bandwidth is easily realized. In addition, since a voltage variation is very small relative to an input dynamic range, a subsequent direct current circuit design may also be easily performed. In addition, the details thereof are seen by "ITE Technical Report Vol. 24, No. 27, PP. 1-4, March, 2000", for example.

However, the source current I1 of the amplification transistor MNA is determined by characteristics of the gate-source voltage Vgs to the source current I1, with respect to the voltage variation (deltaVin) of the floating diffusion FD.

As shown in a central lower portion of FIG. 3, the source current I1 of the transistor MNA is determined by a relation (Id–Vgs) between the drain current Id and the gate-source voltage Vgs in the transistor MNA, and thus it is established as Id=½×β×(Vgs–Vth)^2 ("^" being an exponential expression and "Vth" being a threshold voltage of the transistor MNA). That is, the relation between the drain current Id and the gate-source voltage Vgs in the transistor MNA is a relation having secondary curvilinearity. That is, as shown in the central lower portion of FIG. 3, the source current I1 (=drain current Id) relative to the gate-source voltage Vgs (deltaVin) is varied in a secondary curvilinear manner. In this case, a voltage V1 is nearly constant relative to a change of the current I1, as shown in a right lower portion of FIG. 3.

That is, the relation between the drain current Id and the gate-source voltage Vgs in the transistor MNA is nonlinear. Therefore, when current-voltage conversion is performed by an IV amplification conversion circuit (current-voltage conversion circuit) using the current, it is established as V=I*R ("*" being multiplication). Consequently, since an output voltage is influenced, as it is, due to the secondary curvilinearity, it may be possible to adversely influence linearity when the voltage variation is used as a voltage signal.

In addition, it is also necessary to mount the IV amplification conversion circuit for conversion of a current into a voltage. Furthermore, an impedance conversion circuit is necessary as in the related art, for example, as described in Japanese Unexamined Patent Application Publication No. 2004-023135.

In addition, since an output offset voltage of the IV amplification conversion circuit occurs when the current is deviated by a current mirror circuit in the impedance conversion circuit, an offset cancel circuit is also necessary as a countermeasure and thus the circuit scale is enlarged.

Furthermore, the offset cancel circuit may not be operated in real time, and the offset voltage of the IV amplification conversion circuit necessarily has to be monitored. Accordingly, it is also necessary to provide an offset cancel time for specifying a correction amount of the offset voltage.

In addition, since shot noise is applied to input of the IV amplification conversion circuit by the impedance conversion circuit, it is easily influenced by the noise.

The technology related to Japanese Unexamined Patent Application Publication No. 2004-023135 is a technology proposed for the purpose of reducing the noise. However, the technology slightly improves the reduction of the noise without a change of the configuration itself adding an unnecessary current from the outside, but does not reach a fundamental measure.

In addition, when the threshold voltage Vth of the amplification transistor MNA is varied, an output current Iout is also varied by the same influence. For this reason, the variation appears, as it is, at an output voltage in the related art in which the current Iout is applied, as it is, by the current-voltage conversion.

As described above, the relation of the voltage transmission system and the current transmission system is summarized as follows.

That is, the voltage transmission system has characteristics in which the current is fixed and the input voltage variation deltaVin to the gate is exhibited, as it is, as the voltage variation Vout of the output voltage. For this reason, the voltage transmission system has high linearity but it is difficult to realize high bandwidth.

Meanwhile, the current transmission system has characteristics in which the voltage is fixed at a certain degree and the output current is set as a secondary nonlinear function with respect to the input voltage. For this reason, the current transmission system easily realizes high bandwidth, but has low linearity. In addition, the current transmission system has to have the current-voltage conversion circuit, the impedance conversion circuit, the offset cancel circuit, or the like, and thus the voltage variation of the output voltage becomes larger.

Figure 4:
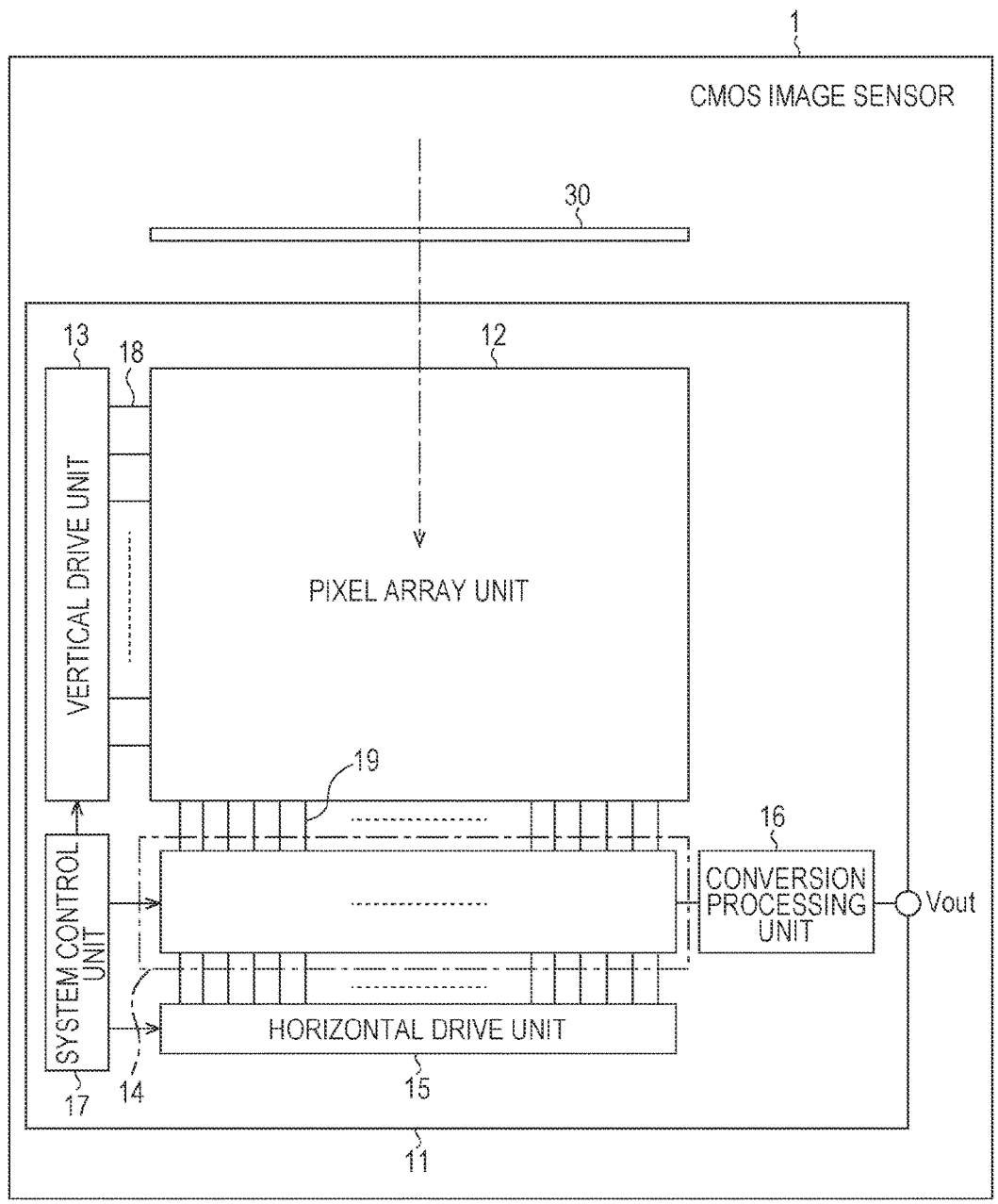
FIG. 4 is a diagram illustrating a configuration example of a CMOS image sensor according to an embodiment of the present disclosure.

Configuration Example of Solid-State Imaging Device to which the Present Disclosure is Applied FIG. 4 is a diagram illustrating a configuration example of a solid-state imaging device, for example, a CMOS (Complementary Metal Oxide Semiconductor) image sensor which is a type of an X-Y address type solid-state imaging device according to an embodiment of the present disclosure. The CMOS image sensor 1 is used in an imaging apparatus. In the CMOS image sensor 1, when incident light is imaged on the CMOS image sensor through an optical block composed of a lens (not shown) and the like, an image of the imaged subject is generated as an image signal composed of a pixel signal of a pixel unit to be output.

The CMOS image sensor 1 of FIG. 4 includes a pixel array unit 12 formed on a semiconductor substrate (hereinafter, also simply referred to as "sensor chip") 11, and a peripheral circuit unit integrated on the same semiconductor substrate 11 as the pixel array unit 12. For example, a vertical drive unit 13, a column processing unit 14, a horizontal drive unit 15, a conversion processing unit 16, and a system control unit 17 are provided as the peripheral circuit unit.

In the pixel array unit 12, each unit pixel (hereinafter, simply referred to as "pixel") (not shown), which includes a photoelectric conversion device for photoelectrically converting incident light composed of visible light indicated by an alternate long and short dashed line into a charge amount according to an amount of the incident light, is arranged in a two-dimensional matrix form. A specific configuration of the unit pixel will be described later. A color filter array 30 is provided at a light receiving surface (light incidence surface) side of the pixel array unit 12.

Furthermore, in the pixel array unit 12, a pixel drive line is arranged for each line in a left and right direction of the drawing (pixel array direction of the pixel line/horizontal direction) and a vertical signal line 19 is formed for each row in an upward and downward direction of the drawing (pixel array direction of the pixel row/vertical direction), with respect to the pixel array in the matrix form. Although one pixel drive line is shown in FIG. 4, the present disclosure is not limited thereto. One end of the pixel drive line is connected to an output end corresponding to each line of the vertical drive unit 13.

The vertical drive unit 13 is configured by a shift register, an address decoder, and the like. Although a specific configuration is not shown in the drawing, the vertical drive unit 13 has a reading scanning system and a sweeping scanning system. The reading scanning system sequentially performs a selection scan line by line with respect to the unit pixel reading signals.

Meanwhile, the sweeping scanning system performs a sweeping scan which sweeps (resets) an unnecessary charge from the photoelectric conversion device of the unit pixel of the reading line, with respect to the reading line in which the reading scan is performed by the reading scanning system, ahead of the reading scan by a time of shutter speed. A so-called electronic shutter operation is performed by sweeping (resetting) the unnecessary charge by means of the sweeping scanning system. Here, the electronic shutter operation means an operation which newly initiates exposure (initiates accumulation of a photo-charge) by discarding a photo-charge of the photoelectric conversion device.

A signal read by a reading operation by means of the reading scanning system corresponds to an amount of light incident after the immediately preceding reading operation or the electronic shutter operation. A period from a reading timing by means of the immediately preceding reading operation or a sweeping timing by means of the electronic shutter operation to a reading timing by means of the present reading operation is an accumulation time (exposure time) of the photo-charge in the unit pixel.

A signal output from each unit pixel of the pixel line which is selectively scanned by the vertical drive unit 13 is supplied to the column processing unit 14 through each vertical signal line 19. The column processing unit 14 performs predetermined signal processing with respect to an analogue pixel signal output from each pixel of the selection line, for each pixel row of the pixel array unit 12.

The signal processing at the column processing unit 14 includes, for example, CDS (Correlated Double Sampling) processing. The CDS processing is processing which incorporates a reset level and signal level output from each pixel of the selection line, obtains a signal of the pixel of one line by taking a level difference, and simultaneously removes fixed pattern noise of the pixel. In some cases, the column processing unit 14 has an A/D conversion function which converts an analogue pixel signal into a digital pixel signal.

The horizontal drive unit 15 is configured by a shift register, an address decoder, and the like. The horizontal drive unit 15 sequentially performs a selection scan of circuit portions corresponding to the pixel rows of the column processing unit 14. A pixel signal which is signal-processed for each pixel row at the column processing unit 14 by the selection scan by means of the horizontal drive unit 15 is output in turn.

The conversion processing unit 16 performs processing for converting a signal, corresponding to a color array of the above-mentioned color filter array (color filter section) 20, which is output from each pixel of the pixel array unit 12, by calculation processing.

The system control unit 17 receives data or the like which commands a clock or an operation mode given from the outside of the sensor chip 11, or outputs data such as inside information of the CMOS image sensor 1. Furthermore, the system control unit 17 has a timing generator which generates various timing signals and performs driving control of the vertical drive unit 13, the column processing unit 14, the horizontal drive unit 15, and the conversion processing unit 16, based on various timing signals generated by the timing generator.

Configuration Example of Unit Pixel

Figure 5:
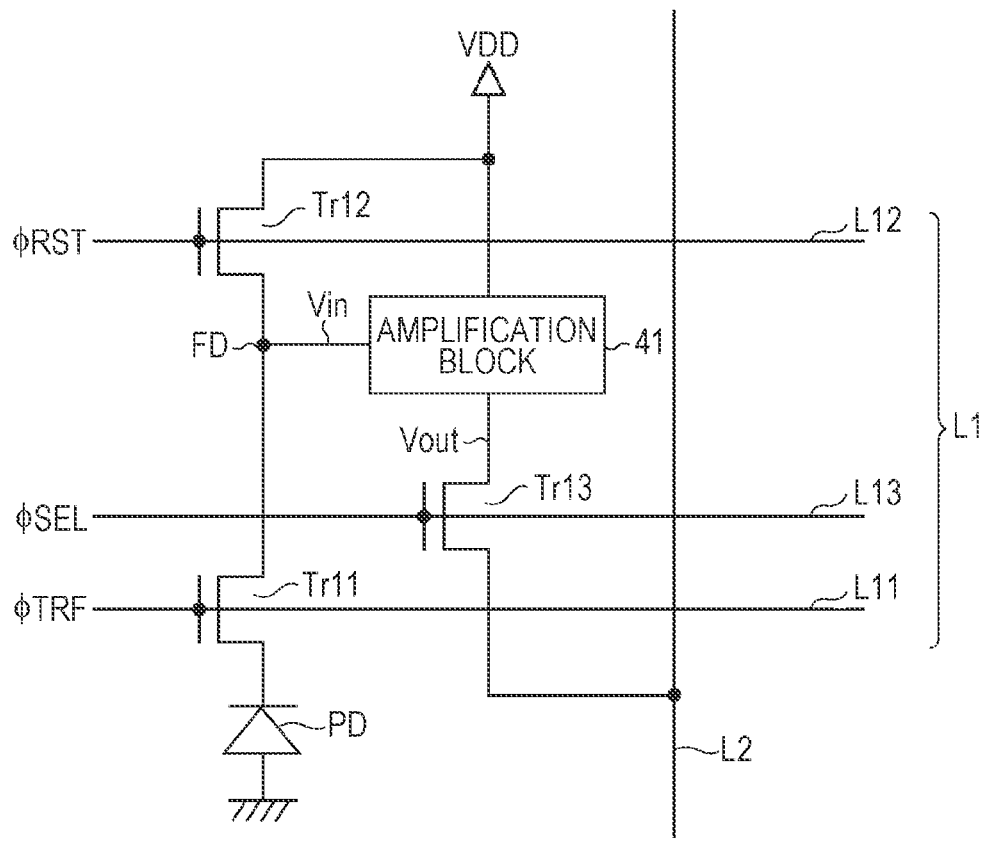
FIG. 5 is a diagram for explaining a configuration example of a unit pixel.

Next, a circuit configuration example of a unit pixel will be described with reference to FIG. 5. FIG. 5 is a circuit diagram illustrating an example of the circuit configuration of the unit pixel. As shown in FIG. 5, the unit pixel according to the present circuit example has a photodiode PD which is a photoelectric conversion device, a transfer transistor Tr11, a reset transistor Tr12, a switch composed of three transistors of a selection transistor Tr13, and an amplification block 41.

With the unit pixel of FIG. 5, three drive wirings of, for example, a transfer line L11, a reset line L12, and a selection line L13 as a pixel drive line L1 are provided in common with respect to each pixel of the same pixel line. Each one end of the transfer line L11, the reset line L12, and the selection line L13 is connected line by line to an output end corresponding to each pixel line of the vertical drive unit 13.

In the photodiode PD, an anode electrode is connected to a negative-side power source (for example, ground) and received light is photoelectrically converted into a signal charge (here, photoelectron) of a charge amount according to an amount of the light. A cathode electrode of the photodiode PD is electrically connected with the amplification block 41 through the transfer transistor Tr11. A node which is electrically connected to the amplification block 41 is referred to as a floating diffusion FD.

The transfer transistor Tr11 is connected between the cathode electrode of the photodiode PD and the floating diffusion FD. A transfer pulse φTRF of high level (for example, VDD level) active (hereinafter, referred to as "high active") is provided to a gate electrode of the transfer transistor Tr11 through the transfer line L11. The transfer transistor Tr11 is turned on by provision of the transfer pulse φTRF and thus the photo-charge which is photoelectrically converted by the photodiode PD is transferred to the floating diffusion FD.

In the reset transistor Tr12, a drain electrode is connected to the pixel power source VDD and a source electrode is connected to the floating diffusion FD. Prior to transfer of the signal charge from the photodiode PD to the floating diffusion FD, a reset pulse φRST of high active is provided to a gate electrode of the reset transistor Tr12 through the reset line L12. The reset transistor Tr12 is turned on by provision of the reset pulse φRST and the floating diffusion FD is reset by discarding the charge of the floating diffusion FD to the pixel power source VDD.

The amplification block 41 outputs a potential of the floating diffusion FD after being reset by the reset transistor Tr12 as a reset signal (reset level) Vreset. Furthermore, the amplification block 41 outputs a potential of the floating diffusion FD after transferring the signal charge by the transfer transistor Tr11 as a pixel signal (signal level).

In the selection transistor Tr13, for example, a drain electrode is connected to output of the amplification block 41 and a source electrode is connected to the vertical signal line L2. A selection pulse φSEL of high active is provided to a gate electrode of the selection transistor Tr13 through the selection line L13. The selection transistor Tr13 is turned on by provision of the selection pulse φSEL so that the unit pixel is in a selected state, and thus the signal output from the amplification block 41 is relayed to the vertical signal line 19.

In addition, the selection transistor Tr13 may also adopt a circuit structure connected between the pixel power source VDD and the amplification block 41.

Configuration Example of Amplification Block

Figure 6:
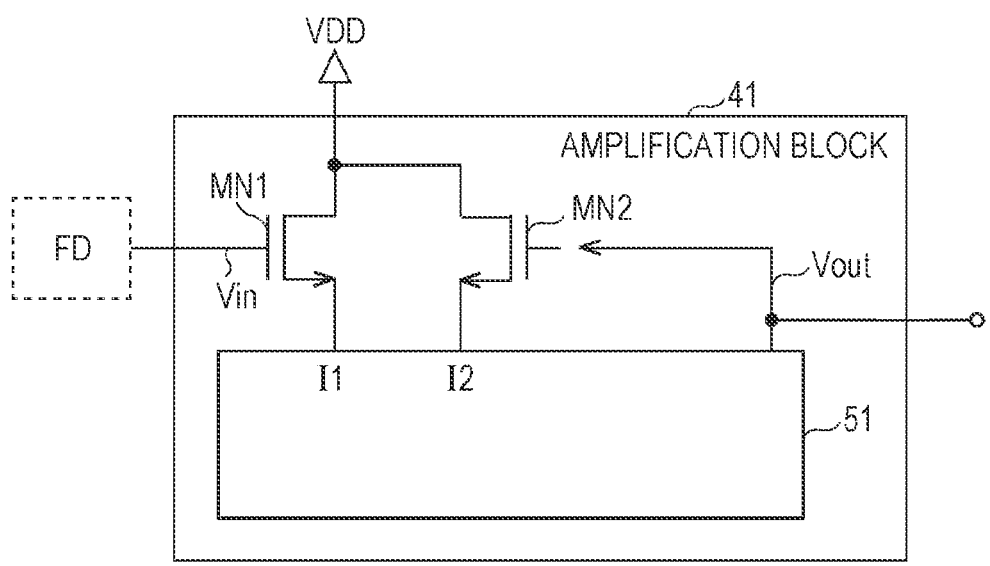
FIG. 6 is a diagram for explaining a configuration example of an amplification block.

Next, a configuration example of the amplification block 41 will be described with reference to FIG. 6. The amplification block 41 is configured by an amplification transistor MN1, a dummy transistor MN2, and a negative feedback circuit 51.

The amplification transistor MN1 is an amplification transistor composed of an initial N-channel MOS (Metal Oxide Semiconductor) type transistor in which a floating diffusion FD is connected to a gate. In addition, the dummy transistor MN2 is a transistor having the same characteristics as the amplification transistor MN1 and a negative feedback is applied to the gate by the negative feedback circuit 51. The negative feedback circuit 51 applies the negative feedback to the dummy transistor MN2 by applying a control voltage to the gate of the dummy transistor MN2 such that respective source currents I1 and I2 of the amplification transistor MN1 and the dummy transistor MN2 are monitored and the source currents are equal to each other. In this case, the negative feedback circuit 51 outputs an output voltage Vout, which is applied as the negative feedback to the gate of the dummy transistor MN2, as a pixel signal based on a signal charge.

By such a configuration, nonlinearity taken by the current I1 flowing between the source and the drain of the amplification transistor MN1 is canceled in such a manner that the source current I2 of the dummy transistor MN2 having the same characteristics as the amplification transistor MN1 coincides with the current I1 and thus the source current I2 is reversely converted into the output voltage Vout which is a gate voltage of the dummy transistor MN2.

First Configuration Example of Negative Feedback Circuit

Next, a first configuration example of a negative feedback circuit 51 will be described with reference to FIG. 7.

The negative feedback circuit 51 is configured by transistors MN3 and MN4 composed of N-channel transistors having the same characteristics and an operational amplifier OP. The transistors MN3 and MN4 are each a so-called diode-connected structure in which drains are short-circuited to gates, respectively. Furthermore, the respective gates are connected to a non-inversion input terminal (+) and an inversion input terminal (−) of the operational amplifier OP. In addition, sources of the transistors MN3 and MN4 are grounded.

An output terminal of the operational amplifier OP is an output voltage Vout of the negative feedback circuit 51, and is configured to be output of the amplification block 41 while the negative feedback is applied to the gate of the dummy transistor MN2.

That is, since a gate-source voltage Vgs of the transistor MN3 is fixed with a predetermined voltage (hereinafter, referred to as "voltage V1") by such a configuration, the source of the transistor MN1 is fixed with the voltage V1. For this reason, the source current I1 of the transistor MN1 is a current which is varied with secondary characteristics of the input voltage Vin by the signal charge of the floating diffusion FD.

In this state, when the input voltage Vin is increased, the current I1 is increased with respect to the source current I2 of the dummy transistor MN2 and the gate-source voltage Vgs of the transistor MN3 is increased. Therefore, the voltage V1 is increased by an equation of $Vgs=\sqrt{(2Id/\beta)}+Vth$, according to the variation of the current I1. The voltage V1 is temporarily increased than a voltage V2 which is a gate-source voltage Vgs of the transistor MN4.

Consequently, the output voltage Vout of the operational amplifier OP is increased, and thus the gate-source voltage Vgs of the dummy transistor MN2 is increased and the source current I2 of the dummy transistor MN2 is also increased.

On the contrary, when the input voltage Vin is decreased, the current I1 is decreased with respect to the source current I2 of the dummy transistor MN2 and the gate-source voltage Vgs of the transistor MN3 is decreased. Therefore, the voltage V1 is temporarily decreased than the voltage V2 which is a gate-source voltage Vgs of the transistor MN4.

Consequently, the output voltage Vout of the operational amplifier OP is decreased, and thus the gate-source voltage Vgs of the dummy transistor MN2 is decreased and the source current I2 of the dummy transistor MN2 is also decreased.

In any case, a variation occurs until a state of voltage V1=voltage V2 and current I1=current I2, and is statically determined when the state is established.

That is, the negative feedback is applied to the gate of the dummy transistor MN2 by the output of the operational amplifier OP, and thus the non-inversion input terminal and inversion input terminal of operational amplifier OP is configured to be a so-called virtual short-circuit (imaginary short-circuit) so that it is drawn into a state of voltage V1=voltage V2 and current I1=current I2.

For this reason, the voltages of the respective terminals (source, gate, and drain) of the amplification transistor MN1 and the dummy transistor MN2 are equal to each other by the formation of current I1=current I2 at a stabilization point. In this case, a nonlinear current taken by the current I1 is reversely converted into the voltage by the flow of the same current I2 as the nonlinear current to the dummy transistor MN2, and thus the nonlinearity operates so as to be canceled.

As a result, the input voltage Vin, by the signal charge of the floating diffusion FD, which is the gate voltage of the amplification transistor MN1 and the output voltage Vout of the operational amplifier OP which is output of the negative feedback circuit 51 may be output as the same voltage.

That is, the negative feedback is applied to the gate voltage of the dummy transistor MN2 such that the source current I2 of the dummy transistor MN2 is equal with respect to the nonlinearity of the current I1, and thus it may be possible to realize current-voltage conversion by a simple circuit configuration without using the impedance conversion circuit, the offset cancel circuit, or the like while the nonlinearity is corrected.

In addition, since an idle current equal to or more than the current I1 necessarily flows in the input portion of the IV amplification conversion circuit by the impedance conversion circuit in the related art, shot noise is often applied. However, only the current I1 flows in the negative feedback circuit 51 and thus an extra noise component is not added, according to the present disclosure. Therefore, it may be possible to reduce noise.

Furthermore, even though a variation in the threshold voltage Vth occurs in the amplification transistor MN1, the negative feedback is applied since the dummy transistor MN2 also has the same characteristics. Therefore, the variation is offset and canceled. As a result, it may be possible to reduce an influence due to the variation of the threshold voltage Vth by means of the amplification block 41 of the present disclosure.

2. Second Embodiment

Second Configuration Example of Negative Feedback Circuit

Although the negative feedback circuit 51 composed of the transistors MN3 and MN4 and the operational amplifier OP has been described above, other circuits may also be used so long as the voltages V1 and V2 are fixable. That is, as shown in FIG. 8, resistances R1 and R2 composed of the same resistances may also be provided instead of the transistors MN3 and MN4, for example.

Figure 7:
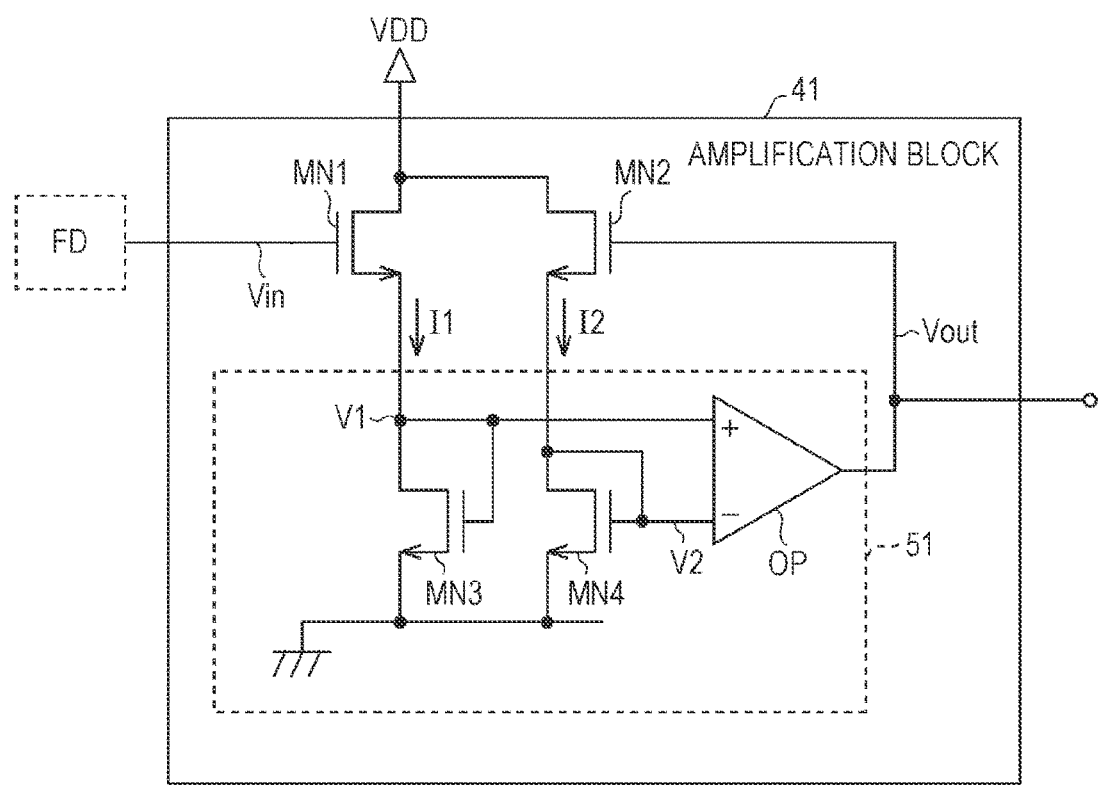
FIG. 7 is a diagram illustrating a configuration example of a negative feedback circuit of FIG. 6 according to a first embodiment.
Figure 8:
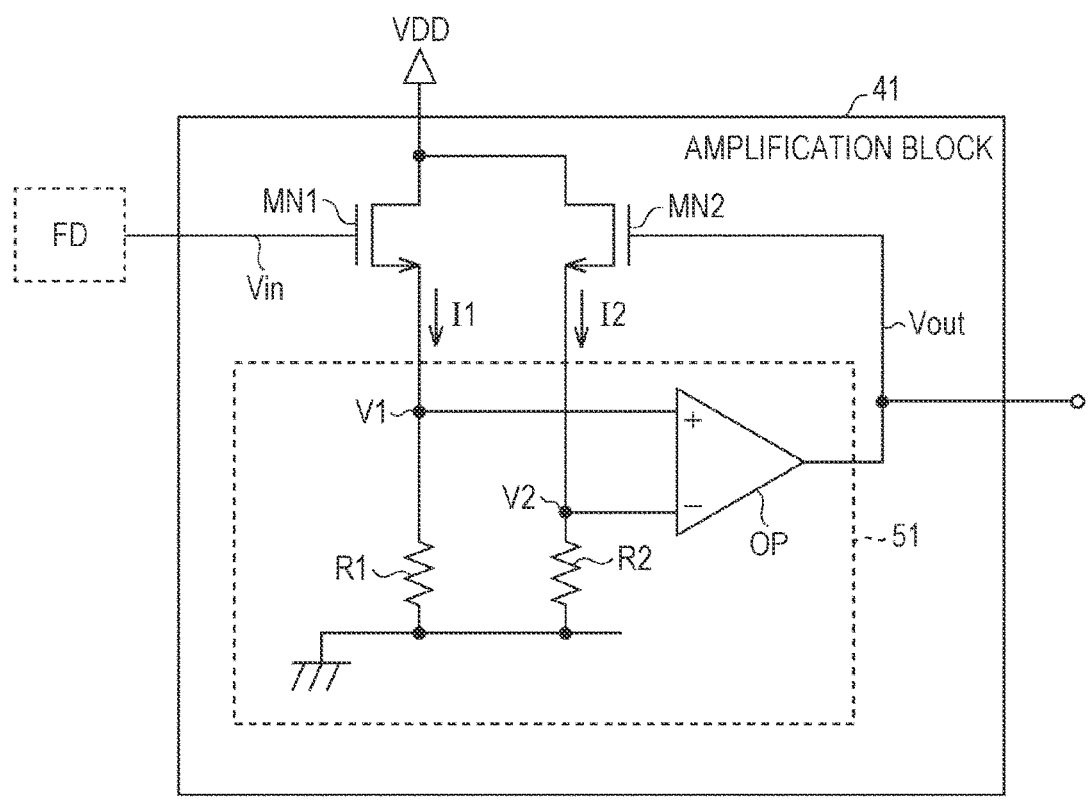
FIG. 8 is a diagram illustrating a configuration example of a negative feedback circuit of FIG. 6 according to a second embodiment.

That is, a negative feedback circuit 51 of FIG. 8 functions similarly to the negative feedback circuit 51 of FIG. 7 and exhibits the same effect in such a manner that a negative feedback is applied such that voltages V1 and V2 coincide with each other by virtual short-circuits of an inversion input terminal and a non-inversion input terminal in an operational amplifier OP.

3. Third Embodiment

Third Configuration Example of Negative Feedback Circuit

Although the example in which the source voltages of the transistors MN1 and MN2 are connected to the non-inversion input terminal and the inversion input terminal of the operational amplifier OP has been described above, the present embodiment may also be configured such that a source of a transistor MN1 and a gate and a drain of a dummy transistor MN2 which is diode-connected are interconnected in series, the source of the transistor MN1 is connected to an inversion input terminal of an operational amplifier OP, and a negative feedback is applied in a manner in which input of the inversion input terminal of the operational amplifier OP is applied to the gate of the transistor MN2 by connecting a non-inversion input terminal to a power source Vref.

Figure 9:
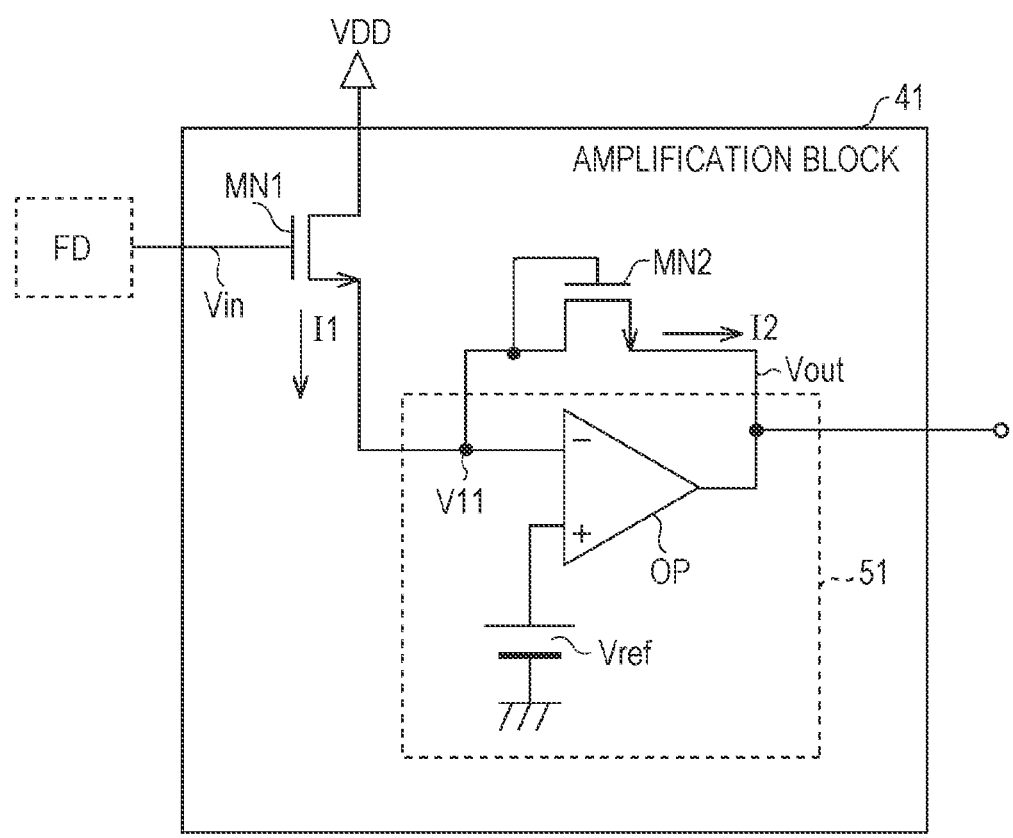
FIG. 9 is a diagram illustrating a configuration example of a negative feedback circuit of FIG. 6 according to a third embodiment.

FIG. 9 shows a configuration example of a negative feedback circuit 51 configured such that a source of a transistor MN1 and a gate and a drain of a dummy transistor MN2 which is diode-connected are interconnected in series, the source of the transistor MN1 is connected to an inversion input terminal of an operational amplifier OP, and a negative feedback is applied in a manner in which input of the inversion input terminal of the operational amplifier OP is applied to the gate of the dummy transistor MN2 by connecting a non-inversion input terminal to a power source Vref.

In the negative feedback circuit 51 shown in FIG. 9, the negative feedback is applied such that respective source currents I1 and I2 of the transistors MN1 and MN2 coincide with each other. In addition, a voltage V11 as an intermediate potential of the transistors MN1 and MN2 is a voltage Vref of the power source Vref by a virtual short-circuit. Therefore, the input of the inversion input terminal of the operational amplifier OP is controlled such that a voltage applied to a gate of a transistor MN4 as the negative feedback is the voltage Vref and respective gate-source voltages Vgs of the transistors MN1 and MN2 coincide with each other. Furthermore, since a source current I2 of the transistor MN2 coincides with a source current I1 of the transistor MN1, a variation amount deltaVout of an output voltage Vout of the operational amplifier OP configured to be a source voltage of the transistor MN2 coincides with a variation amount deltaVin of an input voltage Vin corresponding to a signal charge of a floating diffusion FD. As a result, the negative feedback circuit 51 of the present embodiment functions similarly to the negative feedback circuit 51 of FIG. 7 and exhibits the same effect.

In this case, since the voltage V11 is a bias voltage, the bias voltage may be arbitrarily set by setting the voltage Vref.

4. Fourth Embodiment

Fourth Configuration Example of Negative Feedback Circuit

Although the example in which the source voltages of the transistors MN1 and MN2 are connected to the non-inversion input terminal and inversion input terminal of the operational amplifier OP and the negative feedback is applied using the output voltage Vout of the operational amplifier OP has been described above, the present embodiment may also be configured such that a negative feedback is applied by a current without using an operational amplifier OP.

Figure 10:
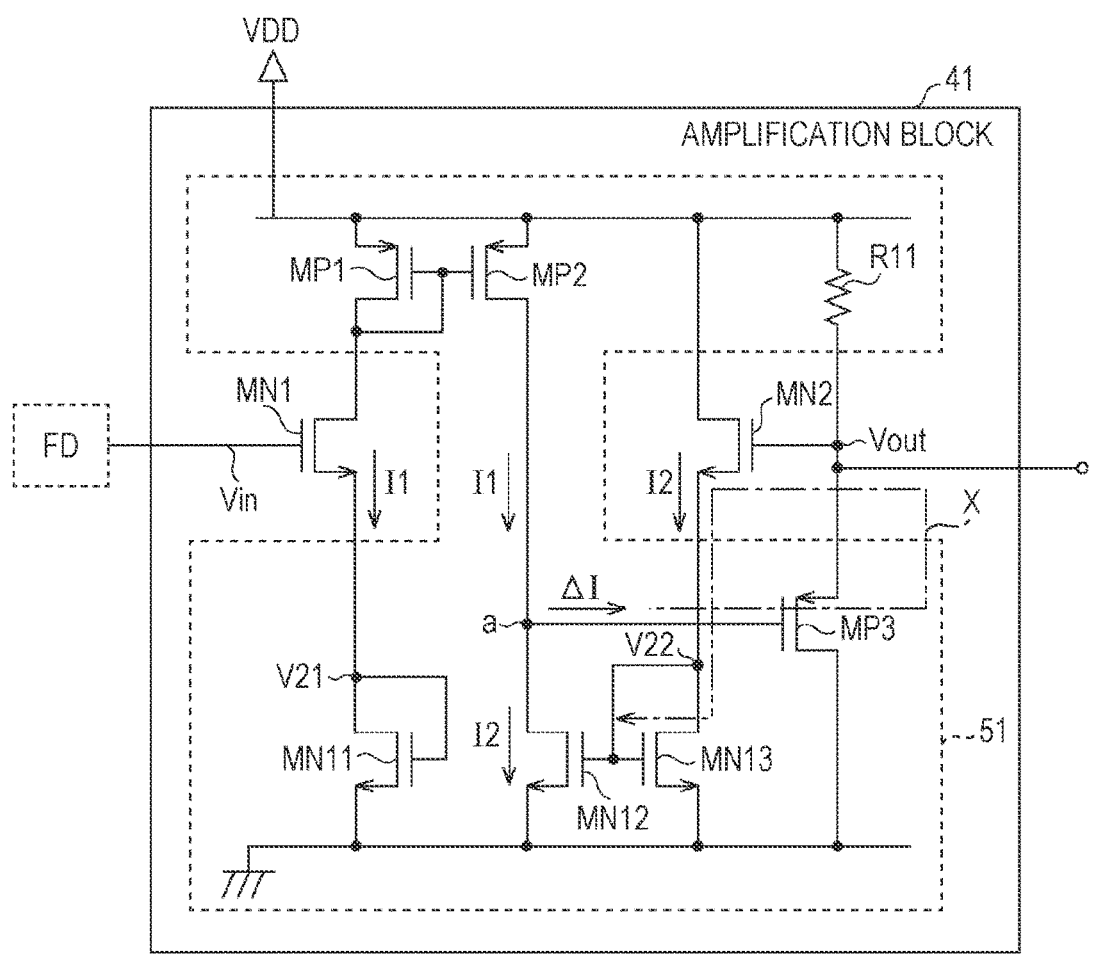
FIG. 10 is a diagram illustrating a configuration example of a negative feedback circuit of FIG. 6 according to a fourth embodiment.

FIG. 10 shows an example of a negative feedback circuit 51 configured such that a negative feedback is applied by a current without using an operational amplifier OP.

The negative feedback circuit 51 of FIG. 10 is configured by transistors MP1 to MP3 composed of p-channel MOS type transistors, transistors MN11 to MN13 composed of N-channel MOS type transistors having the same characteristics, and a resistance R11. In addition, the transistors MP1 and MP2 among the transistors MP1 to MP3 are necessarily formed to have the same characteristics, but the transistor MP3 may also not have the same characteristics as the transistors MP1 and MP2.

Sources of the transistors MP1 and MP2 are connected to a power source VDD, and a drain and a gate thereof are interconnected and further connected to a drain of an amplification transistor MN1. In addition, the source of the transistor MP2 is connected to the power source VDD and connected to a drain of the transistor MN12.

The transistor MN11 is a diode-connection structure to which a gate and a drain are connected and the gate and the drain are further connected to a source of the transistor MN1, and a source of the transistor MN11 is grounded.

In the transistors MN12 and MN13, drains are respectively grounded, and gates are interconnected and further connected to a drain of the transistor MN2. In addition, a source of the transistor MN12 is connected to the drain of the transistor MP2.

A drain of the transistor MP3 is grounded, a gate thereof is connected to a central point a of the transistors MP2 and MN15, and a source thereof is connected to one end portion of the resistance R11 and a gate of the transistor MN2. The other end portion of the resistance R11 is connected to the power source VDD.

By such a configuration, the transistors MN11 and MN13 function as current sources and thus source currents I1 and I2 of the transistors MN1 and MN2 are set. In addition, since the transistors MP1 and MP2 constitute a current mirror circuit, the source current I1 of the transistor MN1 is a current I1 similar to the current in the drain of the transistor MP2.

Similarly, since the transistors MN12 and MN13 also constitute a current mirror circuit, the drain current I2 of the transistor MN12 is a current I2 similar to the current in the drain of the transistor MN13.

The current I2 flows into the gate of the transistor MN2 and is controlled by the source current of the transistor MP3, as indicated by an arrow X of an alternate long and short dashed line in the drawing. Here, the current flows into the gate of the transistor MP3 and the transistor MP3 is controlled by a differential current deltaI ("delta" being indicated by a symbol in the drawing) composed of a difference between the current I1 and the current I2 from the central point a.

However, in this case, an output voltage Vout of the differential current deltaI which is output of the negative feedback circuit 51 is statically determined in a state of current deltaI=0 by application of the negative feedback to the gate of the transistor MN2. Therefore, it becomes a relation of current I1=current I2.

That is, since the transistors MN1 and MN2 are transistors having the same characteristics, the current I1 coincides with the current I2 and respective source voltages V21 and V22 coincide with each other. Consequently, gate-source voltages Vgs of the transistors MN11 to MN13 coincide with each other and gate-source voltages Vgs of the transistors MN1 and MN2 also coincide with each other. As a result, an input voltage Vin as the gate voltage of the transistor MN1 coincides with an output voltage Vout as the gate voltage of the transistor MN2.

By such a configuration, it may be possible to apply the negative feedback by the differential current deltaI without using the operational amplifier while nonlinearity (secondary curvilinearity) of the current I1 is canceled. Furthermore, amplification conversion (current-voltage amplification conversion) of the source current I1 of the transistor MN1 into the output voltage Vout may be achieved.

In addition, although the case of using the current mirror circuit as two stages has been described in the example of FIG. 10, the number of stages other than the same may also be used. For example, only one stage may also be used and three or more stages may also be used.

As described above, according to the present disclosure, the negative feedback is applied to the gate voltage of the dummy transistor MN2 such that the source current I2 of the dummy transistor MN2 having the same characteristics is equal with respect to the nonlinearity of the current I1 which is output of the amplification transistor MN1, and thus it may be possible to realize current-voltage conversion by a simple circuit configuration without using the impedance conversion circuit, the offset cancel circuit, or the like while the nonlinearity is corrected.

In addition, since the idle current equal to or more than the current I1 necessarily flows in the input portion of the IV amplification conversion circuit by the impedance conversion circuit in the related art, shot noise is often applied. However, only the current I1 flows in the negative feedback circuit and thus the current including an extra noise component is not added, according to the present disclosure. Therefore, it may be possible to reduce noise.

Furthermore, even though a variation in the threshold voltage Vth occurs in the amplification transistor MN1, the negative feedback is applied since the dummy transistor MN2 also has the same characteristics. Therefore, the variation is offset and canceled. As a result, it may be possible to reduce an influence due to the variation of the threshold voltage Vth by means of the amplification block 41 of the present disclosure.

The present disclosure is not limited to the embodiments described above, and various modifications may be made within the scope of the disclosure.

In addition, the present disclosure may have the following configurations.

(1) A solid-state imaging device includes a photodiode that generates a signal charge by photoelectric conversion according to received light, a floating diffusion that accumulates the signal charge generated by the photodiode, an amplification transistor that amplifies and outputs a power source voltage according to the signal charge accumulated in the floating diffusion, a dummy transistor having the same characteristics as the amplification transistor, and a negative feedback circuit that applies a negative feedback to the dummy transistor such that respective source currents of the amplification transistor and the dummy transistor are equal to each other, wherein the respective source currents of the amplification transistor and the dummy transistor are controlled so as to coincide with each other by the negative feedback circuit.

(2) In the solid-state imaging device of (1), the negative feedback circuit converts the source current of the amplification transistor into a gate voltage and outputs a gate voltage of the dummy transistor as a pixel signal while the negative feedback is applied by outputting the gate voltage of the dummy transistor.

(3) In the solid-state imaging device of (2), the negative feedback circuit includes two current source circuits configured to be current sources of the respective source currents of the amplification transistor and the dummy transistor, and an operational amplifier that applies the negative feedback by outputting the gate voltage of the dummy transistor such that currents of the two current source circuits coincide with each other.

(4) In the solid-state imaging device of (3), the two current source circuits are configured by respective diode-connected transistors and are each configured such that sources of the amplification transistor and the dummy transistor are connected to respective gate and drain, and the operational amplifier applies the negative feedback by outputting the gate voltage of the dummy transistor such that respective gate-source voltages of the diode-connected transistors configuring the two current source circuits coincide with each other.

(5) In the solid-state imaging device of (3), the two current source circuits are configured by respective resistances connected in series to sources of the amplification transistor and the dummy transistor, and the operational amplifier applies the negative feedback by outputting the gate voltage of the dummy transistor such that both end voltages of the respective resistances connected in series coincide with each other.

(6) In the solid-state imaging device of (1), the current source circuit is configured by an inversion input terminal of an operational amplifier in which a power source is connected to a non-inversion input terminal, and the operational amplifier is configured such that a negative feedback is applied by outputting a gate voltage of the dummy transistor such that gate-source voltages of the dummy transistor and the amplification transistor coincide with each other when a source of the amplification transistor is connected in series to a gate and a drain of the dummy transistor that is diode-connected and the gate and drain of the dummy transistor and the source of the amplification transistor are connected to an inversion input terminal of the operational amplifier, and thus the output voltage is output as a pixel signal.

(7) In the solid-state imaging device of (1), the negative feedback circuit includes a first current source circuit that generates a current coinciding with the source current of the amplification transistor, a second current source circuit that generates a current coinciding with the source current of the dummy transistor, and a negative feedback transistor in which a differential current of both of the first and second current source circuits is input to a gate and a source thereof is connected to the gate of the dummy transistor, and a negative feedback is applied by the differential current.

(8) An imaging apparatus includes a photodiode that generates a signal charge by photoelectric conversion according to received light, a floating diffusion that accumulates the signal charge generated by the photodiode, an amplification transistor that amplifies and outputs a power source voltage according to the signal charge accumulated in the floating diffusion, a dummy transistor having the same characteristics as the amplification transistor, and a negative feedback circuit that applies a negative feedback to the dummy transistor such that respective source currents of the amplification transistor and the dummy transistor are equal to each other, wherein the respective source currents of the amplification transistor and the dummy transistor are controlled so as to coincide with each other by the negative feedback circuit.

(9) An electronic apparatus includes a photodiode that generates a signal charge by photoelectric conversion according to received light, a floating diffusion that accumulates the signal charge generated by the photodiode, an amplification transistor that amplifies and outputs a power source voltage according to the signal charge accumulated in the floating diffusion, a dummy transistor having the same characteristics as the amplification transistor, and a negative feedback circuit that applies a negative feedback to the dummy transistor such that respective source currents of the amplification transistor and the dummy transistor are equal to each other, wherein the respective source currents of the amplification transistor and the dummy transistor are controlled so as to coincide with each other by the negative feedback circuit.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a photodiode that generates a signal charge by photoelectric conversion according to received light;
a floating diffusion that accumulates the signal charge generated by the photodiode;
an amplification transistor that amplifies and outputs a power source voltage according to the signal charge accumulated in the floating diffusion;
a dummy transistor having the same characteristics as the amplification transistor;
a negative feedback circuit that applies a negative feedback to the dummy transistor such that respective source currents of the amplification transistor and the dummy transistor are equal to each other,
wherein the respective source currents of the amplification transistor and the dummy transistor are controlled so as to coincide with each other by the negative feedback circuit; and
a current source circuit,
wherein the current source circuit is configured by an inversion input terminal of an operational amplifier in which a power source is connected to a non-inversion input terminal, and
wherein the operational amplifier is configured such that the negative feedback is applied by outputting a gate voltage of the dummy transistor such that gate-source voltages of the dummy transistor and the amplification transistor coincide with each other when a source of the amplification transistor is connected in series to a gate and a drain of the dummy transistor that is diode-connected and the gate and drain of the dummy transistor and the source of the amplification transistor are connected to an inversion input terminal of the operational amplifier, and thus the output voltage is output as a pixel signal.

2. The solid-state imaging device according to claim 1, wherein the negative feedback circuit converts the source current of the amplification transistor into a gate voltage and outputs a gate voltage of the dummy transistor as a pixel signal while the negative feedback is applied by outputting the gate voltage of the dummy transistor.

3. The solid-state imaging device according to claim 2,
wherein the negative feedback circuit includes two current source circuits configured to be current sources of the respective source currents of the amplification transistor and the dummy transistor, and
wherein the operational amplifier applies the negative feedback by outputting the gate voltage of the dummy transistor such that currents of the two current source circuits coincide with each other.

4. An imaging apparatus comprising:
a photodiode that generates a signal charge by photoelectric conversion according to received light;
a floating diffusion that accumulates the signal charge generated by the photodiode;
an amplification transistor that amplifies and outputs a power source voltage according to the signal charge accumulated in the floating diffusion;
a dummy transistor having the same characteristics as the amplification transistor;
a negative feedback circuit that applies a negative feedback to the dummy transistor such that respective source currents of the amplification transistor and the dummy transistor are equal to each other,
wherein the respective source currents of the amplification transistor and the dummy transistor are controlled so as to coincide with each other by the negative feedback circuit; and
a current source circuit,
wherein the current source circuit is configured by an inversion input terminal of an operational amplifier in which a power source is connected to a non-inversion input terminal, and
wherein the operational amplifier is configured such that the negative feedback is applied by outputting a gate voltage of the dummy transistor such that gate-source voltages of the dummy transistor and the amplification transistor coincide with each other when a source of the amplification transistor is connected in series to a gate and a drain of the dummy transistor that is diode-connected and the gate and drain of the dummy transistor and the source of the amplification transistor are connected to an inversion input terminal of the operational amplifier, and thus the output voltage is output as a pixel signal.

5. The imaging apparatus according to claim 4, wherein the negative feedback circuit converts the source current of the amplification transistor into a gate voltage and outputs a gate voltage of the dummy transistor as a pixel signal while the negative feedback is applied by outputting the gate voltage of the dummy transistor.

6. The imaging apparatus according to claim 5,
wherein the negative feedback circuit includes two current source circuits configured to be current sources of the respective source currents of the amplification transistor and the dummy transistor, and
wherein the operational amplifier applies the negative feedback by outputting the gate voltage of the dummy transistor such that currents of the two current source circuits coincide with each other.

7. An electronic apparatus comprising:
a photodiode that generates a signal charge by photoelectric conversion according to received light;
a floating diffusion that accumulates the signal charge generated by the photodiode;
an amplification transistor that amplifies and outputs a power source voltage according to the signal charge accumulated in the floating diffusion;
a dummy transistor having the same characteristics as the amplification transistor;
a negative feedback circuit that applies a negative feedback to the dummy transistor such that respective source currents of the amplification transistor and the dummy transistor are equal to each other,
wherein the respective source currents of the amplification transistor and the dummy transistor are controlled so as to coincide with each other by the negative feedback circuit; and
a current source circuit,
wherein the current source circuit is configured by an inversion input terminal of an operational amplifier in which a power source is connected to a non-inversion input terminal, and
the operational amplifier is configured such that the negative feedback is applied by outputting a gate voltage of the dummy transistor such that gate-source voltages of the dummy transistor and the amplification transistor coincide with each other when a source of the amplification transistor is connected in series to a gate and a drain of the dummy transistor that is diode-connected and the gate and drain of the dummy transistor and the source of the amplification transistor are connected to an inversion input terminal of the operational amplifier, and thus the output voltage is output as a pixel signal.

8. The electronic apparatus according to claim 7, wherein the negative feedback circuit converts the source current of the amplification transistor into a gate voltage and outputs a gate voltage of the dummy transistor as a pixel signal while the negative feedback is applied by outputting the gate voltage of the dummy transistor.

9. The electronic apparatus according to claim 8,
wherein the negative feedback circuit includes two current source circuits configured to be current sources of the respective source currents of the amplification transistor and the dummy transistor, and
wherein the operational amplifier applies the negative feedback by outputting the gate voltage of the dummy transistor such that currents of the two current source circuits coincide with each other.

* * * * *